(12) United States Patent
Kawai et al.

(10) Patent No.: US 7,749,870 B2
(45) Date of Patent: Jul. 6, 2010

(54) METHOD FOR PRODUCING SOI SUBSTRATE

(75) Inventors: Makoto Kawai, Gunma-ken (JP); Yoshihiro Kubota, Gunma-ken (JP); Atsuo Ito, Gunma-ken (JP); Kouichi Tanaka, Gunma-ken (JP); Yuji Tobisaka, Gunma-ken (JP); Shoji Akiyama, Gunma-ken (JP); Hiroshi Tamura, Gunma-ken (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 12/383,834

(22) Filed: Mar. 27, 2009

(65) Prior Publication Data

US 2009/0246935 A1 Oct. 1, 2009

(30) Foreign Application Priority Data

Apr. 1, 2008 (JP) ............................. 2008-094596

(51) Int. Cl.
*H01L 21/322* (2006.01)

(52) U.S. Cl. ...................... 438/471; 438/479; 438/403; 438/964; 438/967; 257/E21.32; 257/E27.112; 257/E21.561; 257/E33.074

(58) Field of Classification Search ................ 438/471, 438/479, 403, 967, 964, FOR. 457; 257/E27.112, 257/E21.32, E21.561, E33.074
See application file for complete search history.

(56) References Cited

U.S. PATENT DOCUMENTS

| | | | |
|---|---|---|---|
| 5,621,746 A * | 4/1997 | Futatsugi et al. | 372/45.01 |
| 6,362,453 B1 | 3/2002 | Wang et al. | |
| 2004/0012734 A1 * | 1/2004 | Yamanaka et al. | 349/95 |
| 2007/0218657 A1 * | 9/2007 | Bet et al. | 438/479 |
| 2008/0113463 A1 * | 5/2008 | Liu et al. | 438/46 |

FOREIGN PATENT DOCUMENTS

| | | | |
|---|---|---|---|
| JP | 06020895 A | * | 1/1994 |
| JP | 2000-094163 A | | 4/2000 |
| JP | 2006-324530 A | | 11/2006 |
| JP | 2008-094596 A | | 4/2008 |

* cited by examiner

*Primary Examiner*—Michelle Estrada
(74) *Attorney, Agent, or Firm*—Lerner, David, Littenberg, Krumholz & Mentlik, LLP

(57) ABSTRACT

Provided is a method for producing an SOI substrate comprising a transparent insulating substrate and a silicon film formed on a first major surface of the insulating substrate wherein a second major surface of the insulating substrate which is opposite to the major surface is roughened, the method suppressing the generation of metal impurities and particles in a simple and easy way. More specifically, provided is a method for producing an SOI substrate comprising a transparent insulating substrate, a silicon film formed on a first major surface of the transparent insulating substrate, and a roughened second major surface, which is opposite to the first major surface, the method comprising steps of: providing the transparent insulating substrate, mirror surface-processing at least the first major surface of the transparent insulating substrate, forming a silicon film on the first major surface of the transparent insulating substrate, and laser-processing the second major surface of the transparent insulating substrate so as to roughen the second major surface by using a laser.

9 Claims, 2 Drawing Sheets

METHOD FOR PRODUCING SOI SUBSTRATE

CROSS-REFERENCE TO RELATED APPLICATIONS

The present application claims priority from Japanese Patent Application No. JP 2008-094596, filed in the Japanese Patent Office on Apr. 1, 2008, the entire content of which is incorporated herein by reference.

BACKGROUND OF THE INVENTION

The present invention relates to a method for producing an SOI substrate and, more particularly, to a method for producing an SOI substrate in which a silicon film is formed on one major surface of a transparent insulating substrate.

DESCRIPTION OF THE RELATED ART

In order to further increase the performance of semiconductor devices, attention has been focused on a Silicon-on-Insulator (SOI) substrate in recent years. In addition, a Silicon-on-Quartz (SOQ) substrate, a Silicon-on-Glass (SOG) substrate and the like, which are types of SOI substrates wherein the supporting substrates (handle wafers) are not made of silicon, are respectively expected to be applied to TFT-LCDs and radio-frequency (RF) devices, as well as to MEMS products (see JP2006-324530A).

For the above-described SOQ substrate, for example, there has been proposed a production method in which a silicon substrate is used as a donor wafer, a quartz substrate is used as a handle wafer and these dissimilar substrates are bonded together. In the bonded substrate thus fabricated, however, there may be process and evaluation-based problems different from those of a typical SOI substrate produced by bonding silicon substrates to each other, since the quartz substrate is transparent.

As one of such problems, it is difficult for an SOI substrate in which a silicon film is formed on a transparent insulating substrate, such as an SOQ substrate (hereinafter, sometimes referred to as a transparent SOI substrate for short), to be recognized by a substrate-recognizing optical sensor when transported on equipment.

BRIEF SUMMARY OF THE INVENTION

The present invention has been accomplished in view of the above-described problems. It is therefore an object of the present invention to provide a method for producing an SOI substrate comprising a transparent insulating substrate and a silicon film formed on a first major surface of the insulating substrate wherein a second major surface of the insulating substrate which is opposite to the first major surface is roughened, the method suppressing the generation of metal impurities and particles in a simple and easy way.

The present invention has been achieved in order to solve the above-described problems, and provides a method for producing an SOI substrate comprising a transparent insulating substrate and a silicon film formed on a first major surface of the transparent insulating substrate wherein a second major surface which is opposite to the first major surface of the transparent insulating substrate is roughened. The method comprises steps of: providing the transparent insulating substrate, mirror surface-processing at least the first major surface of the transparent insulating substrate, forming a silicon film on the first major surface of the transparent insulating substrate, and laser-processing the second major surface of the transparent insulating substrate so as to roughen the second major surface by using a laser.

By roughening the second major surface of the transparent insulating substrate in this way using a laser, it is possible to perform surface roughening, while suppressing the generation of metal impurities and particles in a simple and easy way. Thus, according to the method for producing an SOI substrate, it is possible to produce an SOI substrate in which a silicon film is formed on a first major surface of a transparent insulating substrate and a second major surface, which is opposite to the first major surface of the transparent insulating substrate, is roughened, while suppressing the generation of metal impurities and particles in a simple and easy way.

Since the rear surface of the transparent insulating substrate is roughened in the SOI substrate produced in this way, a signal from a recognition apparatus using an optical sensor is scattered. Thus, it is possible to prevent the harmful effect that the substrate is not recognized by the recognition apparatus. It is also possible to prevent slippage or the like during substrate transportation.

In addition, in a method for producing an SOI substrate according to the present invention, the step of forming the silicon film can comprise steps of: implanting hydrogen ions, rare gas ions or both of hydrogen ions and rare gas ions from a surface of the silicon substrate or the silicon substrate having an oxide film formed on the surface to form an ion-implanted layer, bonding the ion-implanted surface of the silicon substrate or the silicon substrate having the oxide film formed on the surface and the first major surface of the transparent insulating substrate, and peeling off the silicon substrate or the silicon substrate having the oxide film formed on the surface along the ion-implanted layer so as to form a silicon film on the first major surface of the transparent insulating substrate (claim 8). When the silicon film is formed by peeling off the substrate along the ion-implanted layer after ion implantation, a silicon film having a small thickness and high crystal quality can be formed.

According to the method for producing an SOI substrate of the present invention, it is possible to produce an SOI substrate (transparent SOI substrate) in which a silicon film is formed on a transparent insulating substrate and the rear surface (the other major surface on which a silicon film is not formed) thereof is roughened, while suppressing the generation of metal impurities and particles in a simple and easy way.

Since the surface roughness of the rear surface of the transparent insulating substrate in the SOI substrate produced in this way is large, a signal from a recognition apparatus using an optical sensor is scattered. Thus, it is possible to allow the substrate to be recognized by the recognition apparatus. It is also possible to prevent slippage or the like during substrate transportation.

DETAILED DESCRIPTION

Figure 1A:
FIG. 1 is a flowchart showing one example (first embodiment) of the method for producing an SOI substrate according to the present invention.

Hereinafter, the present invention will be described in more detail.

As described above, there has been such a problem with an SOI substrate in which a silicon film is formed on a transparent insulating substrate, such as an SOQ substrate, that at the time of, for example, transporting the SOQ substrate on equipment, it is difficult for the SOQ substrate to be recognized by a substrate-recognizing optical sensor.

In view of such a problem, the present inventors have discovered that by roughening the rear surface of an SOI substrate (transparent SOI substrate) in which a silicon film is formed on a transparent insulating substrate, i.e., by roughening the major surface of the transparent insulating substrate which the principle surface is opposite to the major surface on which a silicon film is formed, it is possible to scatter a signal from a substrate recognition apparatus using an optical sensor or the like, thereby enabling the substrate to be recognized easily.

However, there has been the problem that abrasive grains and the like get into such a roughened surface of the substrate in large quantities as described above, and result in the generation of metal impurities and/or particles. A possible solution to this problem is to etch the substrate. This solution has caused such a problem, however, that when the substrate is etched in its entirety, a surface opposite to the roughened surface is also etched and therefore the flatness is degraded, or a silicon film peels off if the substrate is one prepared after the silicon film is formed.

In view of such problems, the present inventors have found that a method for roughening the rear surface of the transparent insulating substrate using a laser makes it possible to produce a transparent SOI substrate in which the generation of metal impurities or particles is suppressed in a simple and easy way, without affecting a surface on which a silicon film is to be formed. Thus, the present inventors have accomplished the present invention.

In the present application, a major surface, between the major surfaces of the transparent insulating substrate, on which a silicon film is formed, is referred to as a "first major surface," and a major surface opposite to the first major surface is referred to as a "second major surface," as a matter of convenience.

Explaining the overall flow of the present invention, a transparent SOI substrate is produced by a method comprising steps of: providing a transparent insulating substrate, mirror surface-processing at least one major surface (first major surface) of the transparent insulating substrate, and forming a silicon film on the mirror surface-processed first major surface. In order to produce the transparent SOI substrate whose rear surface is roughened, the second major surface needs to be roughened at a certain stage in the course of production. In the present invention, the second major surface is roughened by laser-processing the surface. In addition, in the present invention, roughening by laser-processing the second major surface can be carried out posterior to or prior to silicon film formation.

In a method for producing an SOI substrate according to the present invention, it is possible to carry out the step of laser-processing posterior to at least the step of forming the silicon film. Alternatively, it is possible to carry out the step of the laser-processing posterior to the step of providing the transparent insulating substrate but prior to the step of forming the silicon film. As described above, the step of laser-processing in the present invention can be carried out posterior to or prior to silicon film formation. Accordingly, it is possible to select the order of the laser-processing step appropriately in accordance with the other production conditions.

The transparent insulating substrate may be any one of a quartz substrate, a glass substrate and a sapphire substrate. The transparent insulating substrate to be used in the method for producing an SOI substrate in the present invention can be selected appropriately from these substrates in accordance with the purpose of a semiconductor device to be fabricated. The thickness of the transparent insulating substrate is not particularly limited. Even when the backside-irradiated indirect abrasion processing which is explained later is used, it is acceptable as long as the laser reaches the contact face between the fluid substance and the backside of the transparent insulating substrate.

Hereinafter, embodiments of the present invention will be described in more detail with reference to the accompanying drawings. It should not be construed that the present invention is limited to these embodiments.

FIG. 1 is a flowchart showing one example (first embodiment) of a method for producing an SOI substrate according to the present invention.

Firstly, an explanation will be given for an embodiment in which the surface roughening of the second major surface by laser processing is carried out after silicon film formation.

As shown in FIG. 1 (a), a transparent insulating substrate 10 is provided (step 1-a). For example, a quartz substrate sliced out of a quartz ingot may be used.

Although the type of transparent insulating substrate to which the present invention is applicable is not limited in particular, the transparent insulating substrate may be one of, for example, a quartz substrate, a glass substrate and a sapphire substrate. Accordingly, after the substrate in question is specified as an SOI substrate, the type can be selected as appropriate, according to the purpose or the like of a semiconductor device to be fabricated.

Figure 1B:
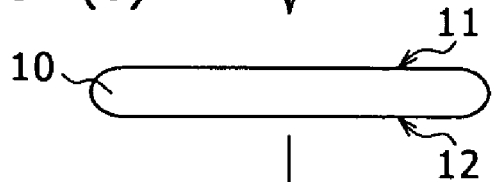

As shown in FIG. 1(b), at least one major surface of the transparent insulating substrate is mirror surface-processed (step 1-b). The mirror surface-processed major surface serves as a major surface on which a silicon film is to be formed, i.e., as a first major surface 11. This method of mirror-surface processing is not limited in particular but may be carried out by combining lapping, etching, polishing and the like, as appropriate.

It may be preferable to carry out at least a treatment for preventing dust generation on the other major surface, i.e., a second major surface 12. Specifically, it is possible to suppress the generation of particles and the like by, for example, etching after lapping. Alternatively, the second major surface 12 may be mirror surface-processed as the first major surface. In this case, there may be used double-sided polishing or the like in which both the first major surface 11 and the second major surface 12 are simultaneously processed.

The step of mirror surface-processing the first major surface of the transparent insulating substrate may be preferably carried out so that surface roughness is less than 0.7 nm in an RMS value. When the step of mirror surface-processing the first major surface of the transparent insulating substrate is carried out so that surface roughness is less than 0.7 nm in an RMS value, it can become easier to form a silicon film since the first major surface is sufficiently flat.

The mirror-surface processing of the first major surface 11 of the transparent insulating substrate 10 is preferably carried out so that surface roughness is less than 0.7 nm in an RMS value. With such a degree of surface roughness, it is possible to bond a silicon substrate to the transparent insulating substrate 10 at even higher strength. In addition, when a silicon film is formed, it is also possible to effectively prevent a degradation in the crystallinity of the silicon film due to the generation of voids or the like which are unbound parts. On the other hand, the lower limit of the RMS value of the surface roughness of the first major surface 11 is not limited in particular and the flatness of the surface may be as high as possible. However, the lower limit may be, in practice, 0.1 nm or so partly because of cost problems involved in order to improve the flatness. The roughness of the second major surface 12 is not limited in particular at this point.

Next, a silicon film is formed on the first major surface 11 of the transparent insulating substrate 10. Although the method of the silicon film formation is not limited in particular, the silicon film can be formed by using, for example, a so-called ion implantation peeling method, as described below.

Figure 1C:
Figure 1D:
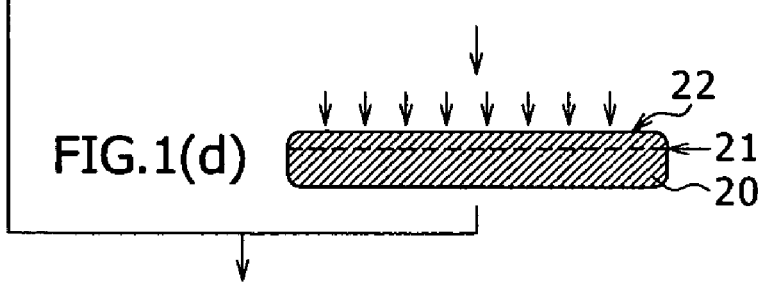

First, as shown in FIG. 1(c), a silicon substrate 20 is provided (step 1-c). Alternatively, there may be used, as necessary, a silicon substrate having an oxide film formed on the substrate. In order to improve the bonding, a surface on the bonding side (surface to be bonded) needs to have a certain degree of flatness. Therefore, at least the bonding-side surface may be mirror-polished beforehand. Preferably, the flatness of this surface may be, for example, less than 0.7 nm in an RMS value.

Next, as shown in FIG. 1 (d), hydrogen ions are implanted into the silicon substrate 20 from a surface (ion-implanted surface 22) thereof to form an ion-implanted layer 21 (step 1-d).

When this ion-implanted layer 21 is formed, rare gas ions may be implanted instead of hydrogen ions, or both hydrogen ions and rare gas ions may be implanted. The other ion implantation conditions such as implantation energy, implantation dose and implantation temperature, may be selected as appropriate so that a film having a predetermined thickness can be obtained. Specific examples of ion implantation conditions may include a substrate temperature during implantation of 250 to 400° C., an ion implantation depth of 0.5 μm, an implantation energy of 20 to 100 keV, and an implantation dose of $1\times10^{16}$ to $1\times10^{17}/cm^2$. The ion implantation conditions are not limited to these, however.

As necessary, it is possible to use a monocrystalline silicon substrate whose surface has an oxide film. When ions are implanted through the oxide film using such a silicon substrate whose surface has an oxide film as mentioned above, an effect of suppressing the channeling of implanted ions can be obtained. Thus, it is possible to further suppress a variation in the depth of ion implantation. Consequently, it is possible to form a film having a more uniform thickness.

Figure 1E:
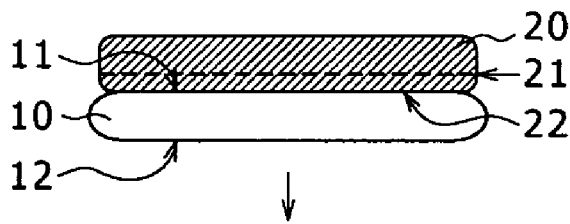

As shown in FIG. 1(e), the first major surface 11 of the transparent insulating substrate 10 and the ion-implanted surface 22 of the silicon substrate 20 are closely contacted and bonded together (step 1-e).

Both the first major surface 11 of the transparent insulating substrate 10 and the ion-implanted surface 22 of the silicon substrate 20 are sufficiently flat surfaces as described above. Accordingly, for example, a synthetic quartz substrate and a silicon substrate can be bonded together simply by closely contacting the substrates to each other at room temperature and then pressurizing the substrates.

However, it is preferable to perform the bonding as described below, in order to bond the substrates together more firmly.

It may be preferable to perform, in advance, a surface activation treatment on the ion-implanted surface 22 of the silicon substrate 20 and the first major surface 11 of the transparent insulating substrate 10. Alternatively, a surface activation treatment may be performed only on either the ion-implanted surface 22 of the silicon substrate 20 or the first major surface 11 of the transparent insulating substrate 10.

A plasma treatment can be performed as the surface activation treatment. When the plasma treatment is used as the surface activation treatment, the number of OH radicals increases in the activation-treated surface of the substrate and, therefore, the surface is activated. Accordingly, by closely contacting the first major surface 11 of the transparent insulating substrate 10 and the ion-implanted surface 22 of the silicon substrate 20 under this condition, it is possible to bond the substrates together more firmly due to hydrogen bonding and the like. The surface activation treatment can also be performed using an ozone treatment. Two or more types of treatment may be used in combination.

The plasma treatment may be carried out, for example, as follows. A substrate having been subjected to cleaning such as RCA cleaning is placed in a vacuum chamber and a gas for plasma is introduced. Then the substrate is exposed to an RF plasma of approximately 100 W for about 5 to 30 seconds, thereby plasma-treating the substrate surface. As the gas for plasma, an oxygen gas can be used, for example, for treating a monocrystalline silicon substrate whose surface has an oxide film formed. A hydrogen gas, an argon gas, a mixed gas of hydrogen and argon, or a mixed gas of hydrogen and helium can be used for treating a monocrystalline silicon substrate whose surface has an oxide film not formed. In addition to these gases, a nitrogen gas or the like may be used.

The ozone treatment may be carried out, for example, as follows. A substrate having been subjected to cleaning such as RCA cleaning is placed in a chamber where the atmosphere has been introduced, and a gas for plasma such as a nitrogen gas or an argon gas is introduced. Then RF plasma is generated to convert oxygen in the atmosphere into ozone, thereby carrying out the ozone-treatment of the substrate surface.

Using an activated surface of the substrate as a bonding surface, when the substrates are closely contacted each other under a decreased or normal pressure at room temperature, the substrates can be bonded together firmly without subjecting to any high-temperature treatment.

After bonding together the silicon substrate and the transparent insulating substrate, it is possible to carry out a heat treatment step in which the bonded substrates are heat-treated at 100 to 300° C.

By bonding together the silicon substrate and the transparent insulating substrate and then heat-treating the bonded substrates at 100 to 300° C., it is possible to increase the bonding strength between the silicon substrate and the transparent insulating substrate. In addition, a heat treatment at such a low temperature is less likely to cause thermal strain, cracks, peel-off or the like due to a difference in thermal expansion coefficient attributable to the use of dissimilar materials. By increasing the bonding strength, it is possible to decrease the ratio of failure occurrence in the step of peeling off.

Figure 1F:
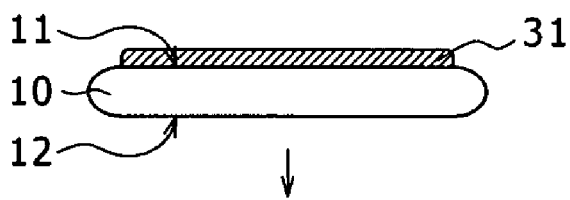

The step of peeling off, in which the silicon substrate 20 is peeled off along the ion-implanted layer 21 so as to leave a film, is carried out. Then a silicon film 31 is formed as shown in FIG. 1(f) (step 1-f).

This peeling-off of the silicon substrate (separation and film formation) can be performed by, for example, applying an external mechanical force. The external mechanical force is not particularly limited and may include a blow of a fluid such as gas and liquid from a side of the ion-implanted layer, and physical impact.

Figure 1G:
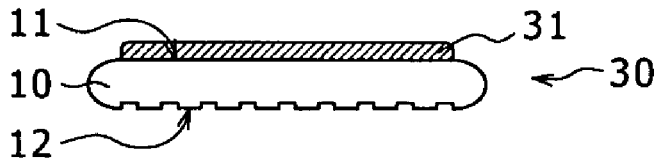

Next, as shown in FIG. 1(g), the second major surface 12 of the transparent insulating substrate 10 is laser-processed and is thereby roughened (step 1-g).

This laser-processing can be performed using a technique capable of processing a surface of a transparent insulating substrate. The step of laser-based processing can comprise causing a phase transition in the second major surface of the transparent insulating substrate by using a CO2 laser. With a technique to roughen the second major surface of the transparent insulating substrate in this way by causing a phase transition such as fusion, coagulation or sublimation, in the second major surface of the transparent insulating substrate using a CO2 (carbon dioxide) laser, it is possible to easily perform a roughening process even in a case where the process is performed on a transparent substrate as in the present invention. For example, the laser processing can be performed by irradiating a surface of the transparent insulating substrate with a CO2 (carbon dioxide) laser and thereby causing a phase transition, such as fusion, coagulation or sublimation, in the surface.

The CO2 laser has a wavelength in the far-infrared region of 10.6 µm and can therefore act also on a transparent insulating substrate such as a quartz substrate. In addition, the CO2 laser can provide a wide range of output power. Accordingly, it is possible to easily control a phase transition in a surface of the transparent insulating substrate.

In this case, the method of laser oscillation may be continuous oscillation or pulse oscillation. Conditions of laser beam irradiation other than the wavelength (frequency), such as a power density, an energy density and a beam profile, are adjusted as appropriate.

The step of laser-processing the second major surface of the transparent insulating substrate may be preferably carried out so that the average transmittance of light having a wavelength region of 250 to 800 nm in a direction perpendicular to the second major surface of the transparent insulating substrate is 10% or lower. When the step of laser-processing the second major surface of the transparent insulating substrate carried out so that the average transmittance of light having a wavelength region of 250 to 800 nm in a direction perpendicular to the second major surface of the transparent insulating substrate is 10% or lower, it is possible to allow a substrate recognition apparatus to more reliably recognize the substrate.

This laser processing may be performed so that the average transmittance of light (hereinafter referred to as perpendicular average transmittance in some cases) having a wavelength region of 250 to 800 nm in a direction perpendicular to a major surface of the transparent insulating substrate 10 (i.e., the thickness direction thereof) is preferably 10% or lower, more preferably 5% or lower. With such a perpendicular average transmittance as described above, an optical sensor-based recognition apparatus can be allowed to recognize the substrate more reliably. In order to attain such a perpendicular average transmittance, an evaluation may be made beforehand on an experimental basis. The evaluation may include, for example, at what degree of laser processing the above-described perpendicular average transmittance becomes available. Then, laser processing may be performed under such a condition.

The perpendicular average transmittance of the transparent insulating substrate 10 and the surface roughness of the second major surface 12 of the transparent insulating substrate 10 interrelate with each other to some degree. Although the perpendicular average transmittance of the transparent insulating substrate 10 is preferably set as described above, the surface roughness of the second major surface 12 of the transparent insulating substrate 10 is not directly limited in particular. The surface roughness may be set to, for example, 0.7 nm or larger in an RMS value, though this depends on various other conditions, such as the type of transparent insulating substrate and the performance of the recognition apparatus.

The upper limit in an RMS value of the surface roughness of the second major surface 12 is not limited in particular, either. The RMS value is preferably as large as possible from the viewpoint of an increase in the ease with which the substrate can be recognized by the recognition apparatus. It is preferable, however, not to make the surface roughness larger than necessary, taking into consideration, for example, the prevention of particle generation. For example, the upper limit may be set to approximately 50 nm in an RMS value.

The step of laser-processing can comprise bringing a fluid substance (solution or the like) into contact with the second major surface of the transparent insulating substrate and abrading the fluid substance by irradiating laser from the first major surface side of the transparent insulating substrate. With such a technique to indirectly roughen the second major surface the transparent insulating substrate through the fluid substance, it is possible to easily perform a roughening process even in a case where the process is performed on a transparent substrate as in the present invention.

This technique is intended to indirectly process the surface of an object by laser-induced molecules and the like in the fluid substance (see, for example, JP 2000-94163A and corresponding U.S. Pat. No. 6,362,453, the disclosures of which are hereby incorporated by reference herein.

In this technique (hereinafter abbreviated as backside-irradiated indirect abrasion processing in some cases), at least the object surface to be processed (i.e., the second major surface 12) comes into contact with the fluid substance.

The fluid substance may be a solution, a dispersion, a gas or a fluidizing powder capable of absorbing the laser beam.

Examples of the fluid substance may include solvent solutions of organic compounds such as aromatic compounds and organic dyes; liquid organic compounds such as benzene, toluene and carbon tetrachlorides; a dispersion containing organic pigments or inorganic pigments; and fluidized powders of organic compounds and inorganic pigments.

Any suitable organic solvent, such as alcohol, ketone, ester, ether or hydrocarbon, may be used for the preparation of the solvent solutions of organic compounds. Examples of preferable solvent solutions of organic compounds may be an acetone solution of pyrene, an acetone solution of benzyl, a tetrahydrofran solution of pyrene, an ethanol solution of rhodamine 6 G and an ethanol solution of phthalocyanine.

It is preferred that the fluid substance can absorb at least 10%, more preferably at least 50%, of the laser beam when the laser beam passes through the fluid substance through a length of 0.1 mm. The absorbance of the fluid can be controlled by adjusting the concentration of the laser-absorbing substances.

Any pulsed laser beam preferably having an intensity of 0.01 to 100 J/cm2/pulse may be used. Examples of preferable laser may include ArF excimer laser ($\lambda$=193 nm), KrCl excimer laser ($\lambda$=222 nm), KrF excimer laser ($\lambda$=248 nm), XeCl excimer laser ($\lambda$=308 nm), XeF excimer laser ($\lambda$=351 nm), dye laser, Kr ion laser, Ar ion laser and copper vapor laser. A harmonic wavelength beam of YAG laser and YLF laser (such as transformed by a non-linear optical element) may be used. In the case of YAG laser, for example, a second harmonic wavelength ($\lambda$=532 nm), a third harmonic wavelength ($\lambda$=355 nm) and a fourth harmonic wavelength ($\lambda$=266 nm) may be used. A laser beam having a wavelength in an ultraviolet region and a pulse width of 10 to 100 ns may be preferably used.

The intensity of the laser beam may vary according to the kind and/or concentration of the fluid substance and the kind of the transparent insulating substrate but should be in the range of 0.01 to 100 J/cm2/pulse, preferably 0.1 to 10 J/cm2/ pulse. When the intensity is more than 100 J/cm2/pulse the transparent insulating substrate may be damaged. When the intensity is less than 0.01 J/cm2/pulse, abrasion may fail to proceed effectively.

The wavelength of the laser may be selected so that the laser can be transmitted by, for example, silicon or quartz and can be absorbed by the fluid substance.

The transparent insulating substrate may be secured by a suitable holder which is fixed to one side of a container for containing the fluid substance. As long as the backside surface of the transparent insulating substrate can be maintained in contact with the fluid substance and an opposing surface thereof can be irradiated with the laser beam, a desired abrasion treatment can be carried out. The treatment can be suitably carried out at room temperature under an ambient pressure. As necessary, the fluid substance can be stirred or circulated during the laser beam irradiation.

In the case of this backside-irradiated indirect abrasion processing, it is possible to flexibly select the wavelength of a laser to be irradiated, by selecting a fluid substance to be abraded. Thus, the backside-irradiated indirect abrasion processing has the advantage that processing conditions can be designed in a relatively flexible manner. Accordingly, the backside-irradiated indirect abrasion processing is especially suitable in a case where the transparent insulating substrate is made of a material difficult to be processed by the direct action of the abovementioned CO2 laser.

Also in this case, the method of laser oscillation may be continuous oscillation or pulse oscillation. Conditions of laser beam irradiation such as a frequency, a power density, an energy density and a beam profile, can be adjusted as appropriate.

When the backside-irradiated indirect abrasion processing is used in the step of laser-processing after the formation of a silicon film as in this first embodiment, a silicon film 31 is already present on the side of the transparent insulating substrate where a laser is irradiated. In this case, it is possible to process the second major surface 12 of the transparent insulating substrate 10 almost without affecting the crystallinity of the silicon film 31, by selecting conditions which allows the laser to be transmitted through the silicon film with a high transmittance (for example, the wavelength of the laser is selected to be in a visible to near-infrared region). In addition, when the silicon film 31 is especially thin (for example, at most several μm or thinner in the ion implantation peeling method), laser absorption in the silicon film is low so that the silicon film is less susceptible to the laser.

By going through the above steps, it is possible to produce an SOI substrate 30 comprising the silicon film 31 on or above the first major surface 11 of the transparent insulating substrate 10.

The order of the steps 1-a to 1-b and steps 1-c to 1-d, which are steps applied to separate substrates, may be reversed as a matter of course, or may be carried out concurrently.

By going through steps 1-a to 1-g, produced is an SOI substrate comprising the transparent insulating substrate and the silicon film formed on the transparent insulating substrate wherein the rear surface of the transparent insulating substrate is roughened. In the present invention, the second major surface 12 is roughened in step 1-g of laser-processing. Accordingly, abrasive grains or the like are not used in contrast with conventional surface roughening such as sandblasting. Consequently, abrasive grains do not get into grooves or the like so that the generation of metal impurities and particles from the second major surface 12 are suppressed. As a result, it is possible to produce a transparent SOI substrate in which dust generation and the like are prevented.

Secondly, an explanation will be given for another embodiment of the method for producing an SOI substrate according to the present invention. The explanation may be omitted or simplified about elements or steps similar to those explained in the first embodiment based on FIG. 1.

FIG. 2 is a flowchart showing another example (second embodiment) of the method for producing an SOI substrate of the present invention.

An explanation will be given for an example in which the step of laser-processing the second major surface for roughening the second major surface is carried out before silicon film formation.

Figure 2A:
FIG. 2 is a flowchart showing another example (second embodiment) of the method for producing an SOI substrate according to the present invention.
Figure 2B:
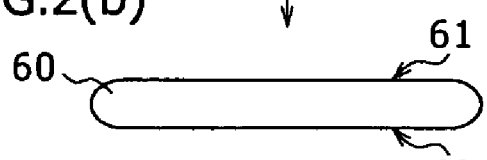
Figure 2C:

As shown in FIGS. 2(a) and 2(b), a transparent insulating substrate 60 is provided (in step 2-a) as in the above-described first embodiment, and then at least one major surface (first major surface 61) of the transparent insulating substrate 60 is mirror surface-processed (in step 2-b). A second major surface 62 is processed in the same way as in the first embodiment.

Next, as shown in FIG. 2 (c), the second major surface 62 of the transparent insulating substrate 60 is laser-processed and is thereby roughened (step 2-c).

In this step, the second major surface 62 can be roughened using a laser capable of processing a surface of the transparent insulating substrate, as in step 1-g of the first embodiment. However, this step differs from step 1-g in that a silicon film is not formed on the first major surface 61.

For example, step 2-c can be carried out by causing a phase transition such as fusion, coagulation or sublimation in the surface of the transparent insulating substrate using a CO2 (carbon dioxide) laser.

A silicon film is not formed on the side of the transparent insulating substrate to be originally irradiated with a laser in this step before silicon film formation. Accordingly, the backside-irradiated indirect abrasion processing can be used in a particularly suitable manner. It is possible to relatively freely set the degree of induction in the fluid substance, for example, using ultraviolet light, since the processing is not subject to restrictions imposed by the presence of the silicon film.

Next, a silicon film is formed on the first major surface 61 of the transparent insulating substrate 60. In the step of forming the silicon film, for example, the ion implantation peeling method can be used as in the first embodiment.

Hereafter, steps 2-d to 2-g shown in FIGS. 2(d) to 2(g) can be carried out in almost the same way as steps 1-c to 1-f in the first aspect. However, steps 2-d to 2-g differ from steps 1-c to 1-f in that the second major surface 62 of the transparent insulating substrate 60 is already roughened by laser processing.

Figure 2D:

First, as shown in FIG. 2(d), a silicon substrate 70 is provided (step 2-d). Also in this step, a silicon substrate whose surface has an oxide film formed may be used as necessary. In addition, at least a surface to be bonded is mirror-polished in advance.

Figure 2E:
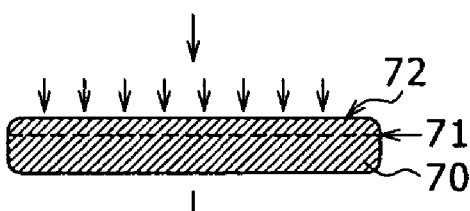

As shown in FIG. 2(e), hydrogen ions are implanted into the silicon substrate 70 from the front surface (ion-implanted surface 72) thereof to form an ion-implanted layer 71 (step 2-e). Ion implantation conditions and the like may be the same as those used in step 1-d of the first embodiment.

Figure 2F:
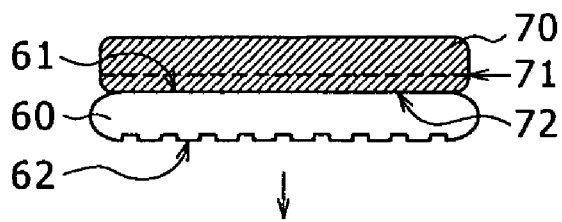

As shown in FIG. 2(f), the first major surface 61 of the transparent insulating substrate 60 and the ion-implanted surface 72 of the silicon substrate 70 are closely contacted each other and bonded together (step 2-f). A specific method for bonding the substrates together and the like may be the same as those of the first embodiment (step 1-e).

Figure 2G:
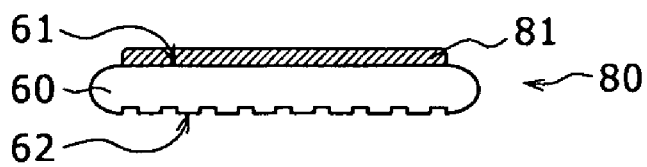

A step of peeling off is carried out where the silicon substrate 70 is peeled off along the ion-implanted layer 71 so as to leave a film. Consequently, a silicon film 81 is obtained as shown in FIG. 2(g) (step 2-g). The step of peeling off the silicon substrate 70 and the like may be carried out in the same manner as in the first embodiment (step 1-f).

By going through the above steps, it is possible to produce an SOI substrate 80 comprising the transparent insulating substrate 60, and the silicon film 81 on or above the first major surface 61 of the transparent insulating substrate 60.

The order of steps 2-a to 2-c and steps 2-d and 2-e, which are steps applied to separate substrates, may be reversed as a matter of course, or may be carried out concurrently.

EXAMPLES

Hereinafter, examples of the present invention will be described in more detail with reference to examples. However, it should not be construed that the present invention is limited to these examples.

Example 1

As described hereinafter, thirty transparent SOI substrates were produced according to a method for producing an SOI substrate using the bonding method as shown in FIG. 1.

First, provided was a synthetic quartz substrate 10 having 150 mm in diameter, directly cut out from a synthetic quartz ingot (step 1-a).

Both surfaces of the synthetic quartz substrate 10 were polished (step 1-b). The flatness of each of major surfaces was set to 2 nm in an RMS value.

A mirror-polished monocrystalline silicon substrate having 150 mm in diameter was provided as a silicon substrate 20. Then a silicon dioxide film having a thickness of 100 nm was formed on a surface of the silicon substrate by thermal oxidation (step 1-c).

Hydrogen ions were implanted through the existing silicon dioxide film, thereby forming a microbubble layer (ion-implanted layer) 21 parallel to the surface at an average depth of advance of ions in the silicon substrate 20 (step 1-d). Ion implantation conditions were set to have an implantation energy of 35 keV, an implantation dose of $9 \times 10^{16}/cm^2$, and an implantation depth of 0.3 μm.

The ion-implanted silicon substrate 20 was placed in a plasma processing apparatus and nitrogen was introduced as a gas for plasma. Then under a depressurized condition of 2 Torr (270 Pa), a 13.56 MHz high-frequency wave was applied between parallel plate electrodes having 300 mm in diameter at an RF power of 50 W so that the ion-implanted surface was subjected to a high-frequency plasma treatment for 10 seconds. In this way, a surface activation treatment was performed on the ion-implanted surface 22 of the silicon substrate 20.

On the other hand, the synthetic quartz substrate 10 was placed in the plasma processing apparatus and a nitrogen gas was introduced to between narrow-spaced electrodes as a gas for plasma. Then a high-frequency wave was applied between the electrodes to generate plasma and a high-frequency plasma treatment was performed for 10 seconds. In this way, a surface activation treatment was performed also on the first major surface 11 of the synthetic quartz substrate 10.

As described above, the surface activation-treated silicon substrate 20 and synthetic quartz substrate 10 were closely contacted each other at room temperature, allowing the activation-treated surfaces to contact each other. Then the rear surfaces of both substrates were strongly pressed in the thickness direction thereof (step 1-e).

The substrate obtained by bonding together the silicon substrate 20 and the synthetic quartz substrate 10 was thermally treated at 300° C. for 30 minutes in order to increase bonding strength.

Next, an external impact was applied to the ion-implanted layers 21 of the silicon substrates 20 to successively peel off the silicon substrates along the ion-implanted layers 21, thus forming silicon film 31 (step 1-f).

Next, the second major surface 12 of the synthetic quartz substrate 10 was roughened using a $CO_2$ laser under such conditions as described below (step 1-g).

Wavelength: 10.6 μm
Output: 100 W

In this way, produced was the transparent SOI substrate 30 comprising the silicon film 31 on the first major surface 11 of the synthetic quartz substrate 10 and the roughened second major surface 12. A recognition test performed on these transparent SOI substrates 30 using a substrate recognition apparatus equipped on a device fabrication apparatus showed that all of the substrates were recognized precisely.

In addition, the crystallinity of the silicon film 31 was sufficiently excellent. Furthermore, dust generation from the transparent SOI substrate 30 as a whole was at the same level as that of a regular mirror-surfaced silicon wafer.

Example 2

Thirty transparent SOI substrates were produced in the same way as in Example 1, except that in step 1-g of laser-processing, the backside-irradiated indirect abrasion was carried out under the following conditions.

Fluid substance: Toluene
Laser: KrF excimer laser (wavelength: 248 nm)

In this way, produced was the transparent SOI substrate 30 comprising the silicon film 31 on the first major surface 11 of the synthetic quartz substrate 10 and the roughened second major surface 12. A recognition test performed on these transparent SOI substrates 30 using a substrate recognition apparatus equipped on a device fabrication apparatus showed that all of the substrates were recognized precisely.

In addition, the crystallinity of the silicon film 31 was sufficiently excellent. Furthermore, dust generation from the transparent SOI substrate 30 as a whole was at the same level as that of a regular mirror-surfaced silicon wafer.

Example 3

As described hereinafter, thirty transparent SOI substrates were produced according to a method for producing an SOI substrate using a bonding method as shown in FIG. 2.

First, provided was a synthetic quartz substrate 60 having 150 mm in diameter, directly cut out from a synthetic quartz ingot (step 2-a).

Both surfaces of the synthetic quartz substrate 60 were polished (step 2-b). The flatness of both major surfaces was set to 2 nm in an RMS value.

Next, the second major surface 62 of the synthetic quartz substrate 60 was roughened using a $CO_2$ laser under the following conditions (step 2-c).

Wavelength: 10.6 μm
Output: 80 W

As in Example 1, a mirror-polished monocrystalline silicon substrate having 150 mm in diameter was provided as a silicon substrate 70. Then a silicon dioxide film having a thickness of 100 nm was formed on a surface of the silicon substrate by thermal oxidation (step 2-d).

Hydrogen ions were implanted through the existing silicon dioxide film, thereby forming an ion-implanted layer 71 (step 2-*e*).

Next, a surface activation treatment was carried out on the respective surfaces to be bonded of the silicon substrate 70 and the synthetic quartz substrate 60 in the same way as in Example 1. The surface activation-treated silicon substrate 70 and synthetic quartz substrate 60 were closely contacted each other at room temperature, allowing the activation-treated surfaces to contact each other. Then the rear surfaces of both substrates were strongly pressed in the thickness direction thereof (step 2-*f*).

The substrate obtained by bonding together the silicon substrate 70 and the synthetic quartz substrate 60 was thermally at 300° C. for 30 minutes in order to increase bonding strength.

Next, an external impact was applied to the ion-implanted layers 71 of the silicon substrates 70 to successively peel off the silicon substrates along the ion-implanted layers 71, thus forming silicon film 81 (step 2-*g*).

In this way, produced was the transparent SOI substrate 80 comprising the silicon film 81 on the first major surface 61 of the synthetic quartz substrate 60 and the roughened second major surface 62. A recognition test performed on these transparent SOI substrates 80 using a substrate recognition apparatus equipped on a device fabrication apparatus showed that all of the substrates were recognized precisely.

In addition, the crystallinity of the silicon film 81 was sufficiently excellent. Furthermore, dust generation from the transparent SOI substrate 80 as a whole was at the same level as that of a regular mirror-surfaced silicon wafer.

Example 4

Thirty transparent SOI substrates were produced in the same way as in Example 3, except that in step 2-*c* of laser-processing, the backside-irradiated indirect abrasion was carried out under the following conditions.

Fluid substance: Toluene
Laser: KrF excimer laser (wavelength: 248 nm)

In this way, produced was the transparent SOI substrate 80 comprising the silicon film 81 on the first major surface 61 of the synthetic quartz substrate 60 and the roughened second major surface 62. A recognition test performed on these transparent SOI substrates 80 using a substrate recognition apparatus equipped on a device fabrication apparatus showed that all of the substrates were recognized precisely.

In addition, the crystallinity of the silicon film 81 was sufficiently excellent. Furthermore, dust generation from a transparent SOI substrate 80 as a whole was at the same level as that of a regular mirror-surfaced silicon wafer.

It should be noted that the present invention is not limited to the above-described embodiments. It is to be understood that the above-described embodiments are only illustrative and any other embodiments having configurations, operations and results which are substantially the same as the technical ideas described in the claims of the present application are included in the scope of the present invention.

The invention claimed is:

1. A method for producing an SOI substrate comprising a transparent insulating substrate and a silicon film formed on a first major surface of the transparent insulating substrate wherein a second major surface of the transparent insulating substrate which is opposite to the first major surface is roughened, the method comprising steps of:
   providing a transparent insulating substrate,
   mirror surface-processing at least the first major surface of the transparent insulating substrate,
   forming a silicon film on the mirror surface-processed first major surface of the transparent insulating substrate, and
   laser-processing the second major surface of the transparent insulating substrate so as to roughen the second major surface by using a laser.

2. The method for producing an SOI substrate according to claim 1, wherein the step of laser-processing comprises causing a phase transition in the second major surface of the transparent insulating substrate by using a $CO_2$ laser.

3. The method for producing an SOI substrate according to claim 1, wherein the step of laser-processing comprises bringing a fluid substance into contact with the second major surface of the transparent insulating substrate and abrading the fluid substance by irradiating the laser from a first major surface side of the transparent insulating substrate.

4. The method for producing an SOI substrate according to claim 1, wherein the step of laser-processing is carried out posterior to at least the step of forming the silicon film.

5. The method for producing an SOI substrate according to claim 1, wherein the step of laser-processing is carried out posterior to the step of providing the transparent insulating substrate but prior to the step of forming the silicon film.

6. The method for producing an SOI substrate according to claim 1, wherein the step of mirror surface-processing is carried out so that surface roughness becomes less than 0.7 nm in an RMS value.

7. The method for producing an SOI substrate according to claim 1, wherein the step of laser-processing is carried out so that an average transmittance of light having a wavelength region of 250 to 800 nm in a direction perpendicular to the second major surface of the transparent insulating substrate is 10% or lower.

8. The method for producing an SOI substrate according to claim 1, wherein the step of forming the silicon film comprises steps of:
   implanting hydrogen ions, rare gas ions or both of hydrogen ions and rare gas ions from a surface of a silicon substrate or a silicon substrate having oxide film formed on the surface to form an ion-implanted layer in the silicon substrate,
   bonding the ion-implanted surface of the silicon substrate or the silicon substrate having the oxide film formed on the surface and the first major surface of the transparent insulating substrate; and
   peeling off the silicon substrate or the silicon substrate having the oxide film formed on the surface along the ion-implanted layer so as to form a silicon film on the first major surface of the transparent insulating substrate.

9. The method for producing an SOI substrate according to claim 1, wherein the transparent insulating substrate is any one of a quartz substrate, a glass substrate and a sapphire substrate.

* * * * *